United States Patent
Putta et al.

(10) Patent No.: US 10,103,702 B2
(45) Date of Patent: Oct. 16, 2018

(54) VOLUME CONTROL RATES

(71) Applicant: HARMAN INTERNATIONAL INDUSTRIES, INC., Stamford, CT (US)

(72) Inventors: Satish K. Putta, Oak Park, CA (US); Shaomin Sharon Peng, Agoura Hills, CA (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 14/904,845

(22) PCT Filed: Jul. 18, 2014

(86) PCT No.: PCT/US2014/047213
§ 371 (c)(1),
(2) Date: Jan. 13, 2016

(87) PCT Pub. No.: WO2015/010031
PCT Pub. Date: Jan. 22, 2015

(65) Prior Publication Data
US 2016/0142029 A1   May 19, 2016

Related U.S. Application Data

(60) Provisional application No. 61/847,898, filed on Jul. 18, 2013.

(51) Int. Cl.
*H03G 7/00* (2006.01)
*H03G 3/30* (2006.01)
(Continued)

(52) U.S. Cl.
CPC ............... *H03G 7/004* (2013.01); *H03G 3/02* (2013.01); *H03G 3/3026* (2013.01); *H04R 3/00* (2013.01); *H04R 2430/01* (2013.01)

(58) Field of Classification Search
None
See application file for complete search history.

(56) References Cited

U.S. PATENT DOCUMENTS 9,112,466 B1 *   8/2015   Koh ......................... H03G 3/02
2002/0031236 A1   3/2002   Shimizu et al.
(Continued)

FOREIGN PATENT DOCUMENTS

CN           1335693 A     2/2002
CN         101449595 A     6/2009
(Continued)

OTHER PUBLICATIONS

International Search Report and Written Opinion dated Nov. 5, 2014 in PCT/US2014/047213.
(Continued)

*Primary Examiner* — Curtis Kuntz
*Assistant Examiner* — Kenny Truong
(74) *Attorney, Agent, or Firm* — Brooks Kushman P.C.

(57) ABSTRACT

A volume controller may maintain a volume mapping including a plurality of zones of volume level, each zone defined according to a range of included volume levels and specifying a volume ramp up control rate and a volume ramp down control rate for adjustment of volume levels within the range, determine, according to the volume mapping based on a current volume level and a direction of a requested volume change, a step value for adjusting the current volume level, and adjust the current volume level according to the step value.

21 Claims, 3 Drawing Sheets

(51) Int. Cl.
*H03G 3/02* (2006.01)
*H04R 3/00* (2006.01)

(56) References Cited

U.S. PATENT DOCUMENTS

| | | | |
|---|---|---|---|
| 2006/0126865 A1* | 6/2006 | Blamey | H03G 3/32 |
| | | | 381/102 |
| 2007/0206820 A1 | 9/2007 | Ikawa | |
| 2008/0089535 A1 | 4/2008 | Hong | |
| 2013/0038546 A1 | 2/2013 | Mineo | |

FOREIGN PATENT DOCUMENTS

| | | |
|---|---|---|
| CN | 102726060 A | 10/2012 |
| CN | 102929573 A | 2/2013 |
| JP | 08-162864 A | 6/1996 |
| JP | 2000031761 A | 1/2000 |
| JP | 2002-101485 A | 4/2002 |
| JP | 2008-005332 A | 1/2008 |
| JP | 2008-211398 A | 9/2008 |
| JP | 4948202 B2 | 6/2012 |
| KR | 10-2009-0012446 A | 2/2009 |
| WO | 2013041875 A2 | 3/2013 |

OTHER PUBLICATIONS

International Search Report in PCT/US2014/047213 dated Nov. 5, 2014.
International Preliminary Report on Patentability in PCT/US2014/047213 dated Jan. 19, 2016.
Supplementary European Search Report and Opinion in EP 148265945 dated Jul. 13, 2016.

* cited by examiner

VOLUME CONTROL RATES

CROSS-REFERENCE TO RELATED APPLICATION

This application is the U.S. national phase of PCT Application No. PCT/US2014/047213 filed on Jul. 18, 2014, which claims the benefit of U.S. provisional application Ser. No. 61/847,898 filed Jul. 18, 2013, the disclosures of which are incorporated in their entirety by reference herein.

TECHNICAL FIELD

Aspects as disclosed herein generally relate to a segmented linear approach to volume control rates for volume ramp up and ramp down.

BACKGROUND

Human perception of sound is not linear with respect to sound pressure level. Moreover, human perception of change in loudness is also not linear. For quiet sounds, the human ear is less sensitive to changes in volume as compared to the sensitivity to changes at higher volumes.

SUMMARY

In a first illustrative embodiment, a system includes volume controller configured to maintain a volume mapping including a plurality of zones of volume level. Each zone may be defined according to a range of included volume levels, and may specify a volume ramp up control rate and a volume ramp down control rate for adjustment of volume levels within the range. The controller may determine, according to the volume mapping based on a current volume level and a direction of a requested volume change, a step value for adjusting the current volume level, and may adjust the current volume level according to the step value.

In a second illustrative embodiment, a system includes a volume controller configured to maintain a first volume mapping and a second volume mapping. The first volume mapping may include a plurality of zones of volume level, where each zone is defined according to a range of volume level and specifying a volume ramp up control rate and a volume ramp down control rate for adjusting volume levels within the zone. The second volume mapping may include a second plurality of zones of volume level, where each zone is defined according to a range of volume level and specifying a volume ramp up control rate and a volume ramp down control rate for adjusting volume levels within the zone. The controller may further identify whether to use the first volume mapping or the second volume mapping according to a requested rate of change to a current volume level, and determine, according to the identified volume mapping based on a current volume level and a direction of a requested volume change, a step value for adjusting the current volume level.

In a third illustrative embodiment, a non-transitory computer-readable medium encoded with computer executable instructions, the computer executable instructions executable by a processor, the computer-readable medium comprising instructions configured to perform operations of a volume controller. The operations may include maintaining a volume mapping including a plurality of zones of volume level, where each zone is defined according to a range of volume level and specifying a volume ramp up control rate and a volume ramp down control rate for adjusting volume levels within the zone. The operations may further include determining, according to the volume mapping based on a current volume level and a direction of a requested volume change, a step value for adjusting the current volume level, adjust the current volume level according to the step value.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

To estimate the non-linear characteristics of the human ear, a volume control in an audio system may be designed to provide logarithmic control of volume level. While a logarithmic volume control may be an improvement over a linear taper volume control, a user of the audio system may desire more sensitive control of volume in certain volume ranges as compared to others. Moreover, the user of the audio system may desire relatively more sensitive volume control in one direction of volume change as compared to the other. In an example, the user may desire sensitive control of volume level at normal listening levels, but at a very low volume level may be satisfied with more coarse adjustments. In another example, if the current volume level is too loud, the user may want to utilize relatively larger steps to quickly come down to a normal listening level, but, at a very low volume level may prefer relatively smaller steps to be able to slowly draw volume down to zero.

An audio system may utilize a segmented linear approach to approximate ear non-linearity while also addressing specific volume control use cases. In the segmented linear approach, a non-linear curve may be simplified into a plurality of regions, or zones. Each zone may be defined according to a range of included volume levels, and may be associated with a control rate of volume increase and a control rate of volume decrease. In some cases, such as for zones within a normal listening volume range, zones may include the same volume ramp up and volume ramp down control rates for the same current volume value. In other cases, such as for zones covering quiet or loud volume levels, the zones may include different volume ramp up and volume ramp down control rates for the same current volume value.

The audio system may receive volume control input requesting a change in the current volume level via a volume control interface. Depending on the zone including the current volume level and the direction of change in volume being requested, the audio system may determine, according to the zones, a control rate at which the volume should change. Using the determined control rate, the audio system may adjust the current volume according to the received volume control input.

Figures 1, 3:
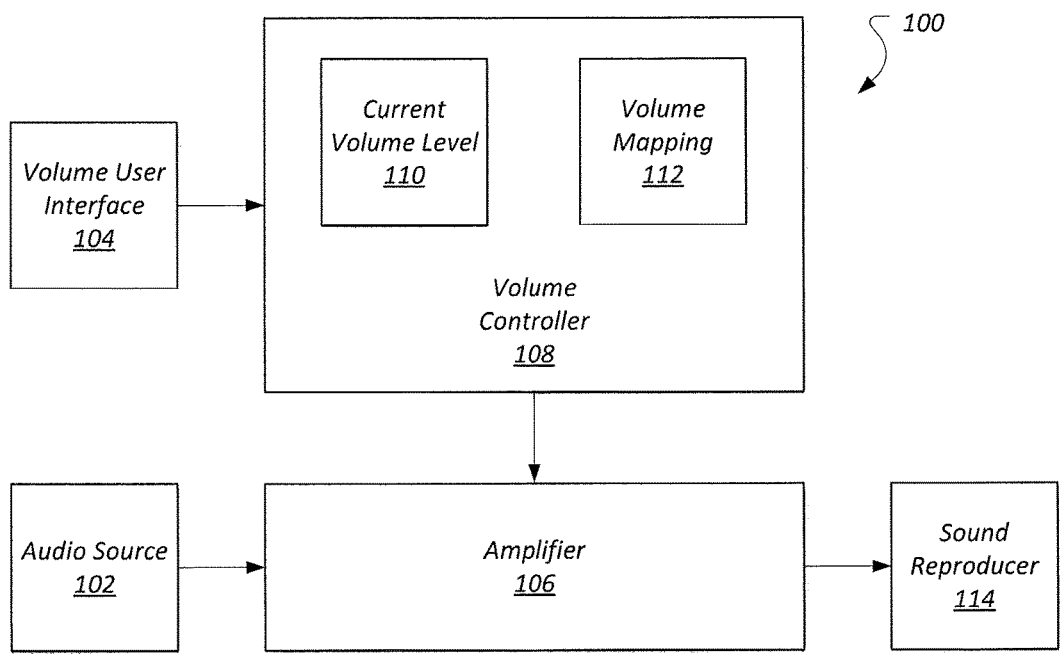
FIG. 1 illustrates a block diagram of an audio system in accordance to one embodiment.
FIG. 3 illustrates an look-up table of the volume mapping, including volume ramp up control rates and volume ramp down control rates indexed according to zone in accordance to one embodiment.

FIG. 1 illustrates an audio system 100 in accordance to one embodiment. As illustrated, the audio system 100 includes an audio source 102, a volume user interface 104, an amplifier 106, a volume controller 108 having a current volume level 110 and a volume mapping 112, and a sound reproducer 114. The audio source 102 may be configured to provide the amplifier 106 with an electric signal encoding audio content. The volume user interface 104 may be configured to receive user or other volume input regarding a change in desired volume level to be provided by the audio system 100. The volume controller 108 may be configured to receive the user input via the volume user interface 104, determine an adjusted current volume level 110 according to the input and the volume mapping 112, and provide the new current volume level 110 to the amplifier 106. The amplifier 106 may be configured to receive the audio signal from the audio source 102, receive the current volume level 110 from the volume controller 108, amplify the audio signal according to the current volume level 110, and provide the amplified audio signal to the sound reproducer 114. The sound reproducer 114 may be configured to receive the amplified audio signal from the amplifier 106, and produce sound pressure waves in accordance with the amplified electric signal.

The audio source 102 may include various types of audio equipment or other devices configured to provide audio content, such as radio receivers, portable music players, compact disk (CD) players, audiocassette players, personal computers, portable computers, personal digital assistants (PDA), mobile phones, tablet devices, or other microprocessor-based entertainment devices such as set-top boxes, etc. The audio content may include content decoded from various sources, such as from received radio transmissions, audio content received as a portion of a phone conversation, and audio content stored on the audio source 102 or on a storage medium provided to the audio source 102 (e.g., via a compact disk, a tape, a memory card, etc.).

The volume user interface 104 may be configured to receive user input regarding a desired volume level to be provided by the audio system 100. In an example, the volume user interface 104 may include a potentiometer having a resistive element (e.g., a logarithmic-taper resistive element), where output voltage is a function of a slider position across the resistive element. In another example, the volume user interface 104 may include a digital control, such as a digital knob or up/down control buttons, where the output of the volume user interface 104 may be specified as a digital numeric value or other digital signal.

The amplifier 106 may be configured to prepare the electrical audio signal received from the audio source 102 to drive the sound reproducer 114. To do so, the amplifier 106 may amplify the received audio signal to a current volume level 110 set by the volume controller 108 according to user input provided via the volume user interface 104. The current volume level 110 may be indicative of an amount of amplification to be performed to the received audio signal to drive the sound reproducer 114. As one possibility, the current volume level 110 may be maintained as a decibel (dB) level amount of gain to be applied to the audio signal to generate the output to the sound reproducer 114. The sound reproducers 114 may include headphones, home loudspeakers, or vehicle sound system elements, as some possibilities.

The level of output provided from amplifier 106 to the sound reproducer 114 may be adjusted by the volume controller 108 according to input received from the volume user interface 104. In an example, a user may turn a volume user interface 104 clockwise to request an increase in the current volume level 110, and may turn the volume user interface 104 counterclockwise to request a decrease in the current volume level 110.

When the user requests a change in volume level, the volume controller 108 may determine an amount to increase and decrease to the current volume level 110 according to various factors. These factors may include the current volume level 110, a speed of the user interaction with the volume user interface 104, whether the current volume level 110 is being increased or decreased, and a volume mapping 112 including information indicative of how large of an increase or decrease in volume to apply. Further aspects of the change in the current volume level 110 performed by the volume controller 108 using the volume mapping 112 are discussed below with respect to FIGS. 2-4.

Figure 2:
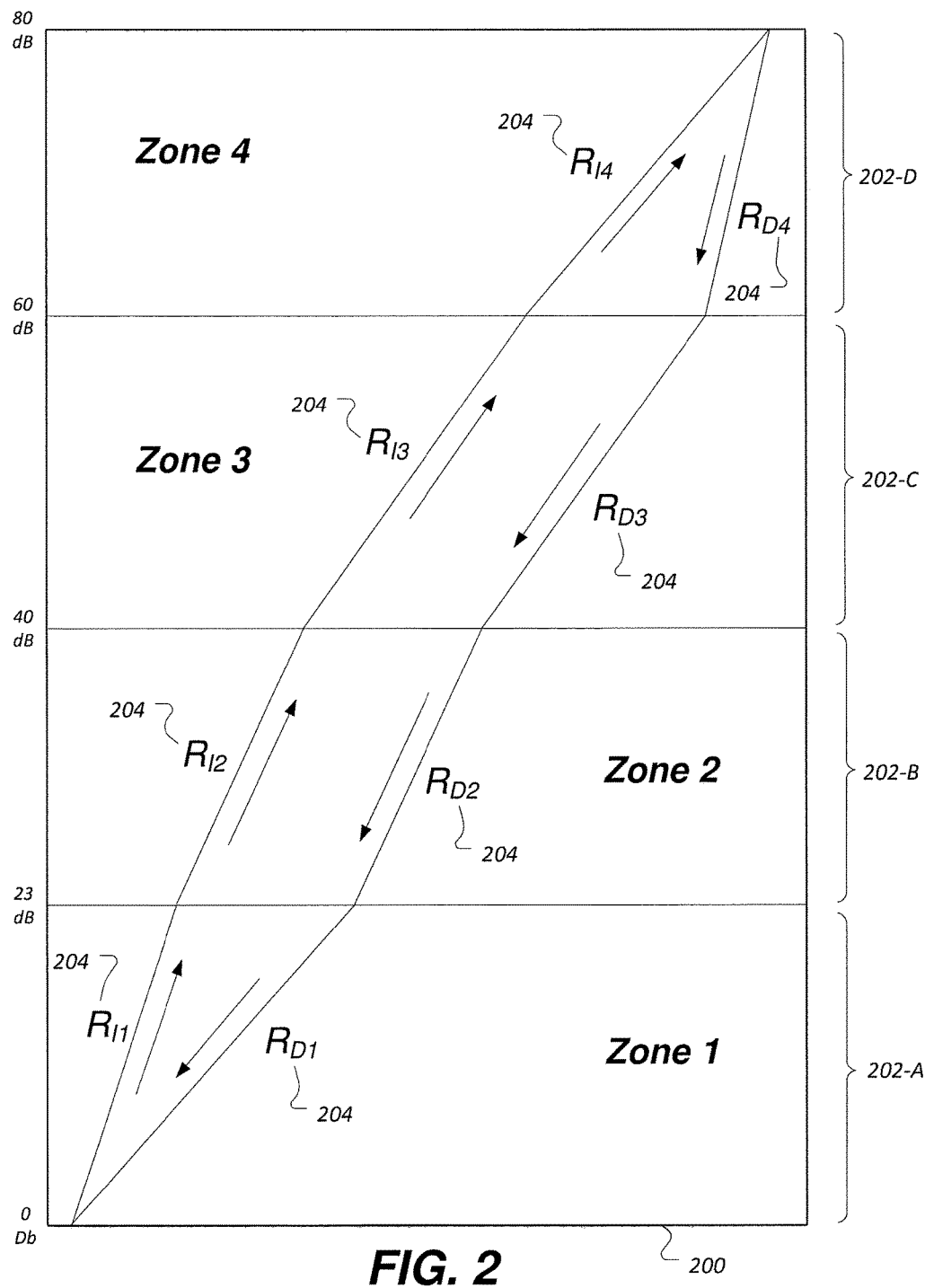
FIG. 2 illustrates an chart of volume ramp up and volume ramp down control rates over various zones in accordance to one embodiment.

FIG. 2 illustrates a chart 200 of a volume mapping 112 including volume ramp up control rates 204 and volume ramp down control rates 204 over various zones 202 in accordance to one embodiment. The volume mapping 112 may include information used by the volume controller 108 to determine a step size for volume adjustments made to the current volume level 110 of output of the amplifier 106 based on the current volume level 110.

The volume mapping 112 may include 'n' sections 202 or zones 202 of an overall volume range of the audio system 100, for example, from 0 dB to 80 dB. As illustrated, the volume mapping 112 includes four zones 202-A through 202-D (collectively 202). The first zone 202-A covers a range of output from substantially no output at 0 dB to a low point of normal hearing, e.g., 23 dB as shown. The second zone 202-B covers a range of output from the low point of normal hearing to a midpoint of the normal hearing range, e.g., 40 dB as shown. The third zone 202-C covers a range of output from the midpoint of the normal hearing range to a comfortable maximum level of volume, e.g., 60 dB as shown. The fourth zone 202-D covers a range of output from the comfortable maximum level of volume to a maximum volume level of the audio system 100, e.g., 80 dB as shown. It should be noted, however, that the number of zones 202 and the particular ranges covered by the zones 202 may vary from implementation to implementation, and more, fewer, and differently divided zones 202 may be used.

The volume mapping 112 may include a volume ramp up change control rate 204 for each zone 202. For example, in the zone 202-A, the ramp up change control rate 204 $R_{r1}$ may be set to 1.0 dB volume increments to allow a user to quickly increase volume into the normal listening zones 202. In the zone 202-B, the ramp up change control rate 204 $R_{r2}$ may be set to 0.5 dB increments to provide somewhat more sensitive control of the listening volume in the lower end of the normal listening range. In the zone 202-C, the ramp up change control rate 204 $R_{r3}$ may be set to 0.25 dB increments to provide for even finer control in the upper end of the normal listening range. In the zone 202-D, the ramp up change control rate 204 $R_{I4}$ may be set to 0.1 dB increases to give very fine control of volume at high volumes levels, e.g., to avoid overshoot in user volume selection.

The volume mapping 112 may also include a volume ramp down change control rate 204 for each zone 202. For example, in the zone 202-D, the ramp down change control rate 204 $R_{D4}$ may be set to 1.0 dB volume decrements to allow a user to quickly decrease volume into the normal listening zones 202. In the zone 202-C, the ramp down change control rate 204 $R_{D3}$ may be set to 0.25 dB decreases to provide for greater control in that region of relatively higher hearing sensitivity, consistent with the increase change control rate 204 $R_{I3}$ for the zone 202-C. In the zone 202-B, the ramp down change control rate 204 $R_{D2}$ may be set to 0.5 dB decreases to provide somewhat more sensitive control of the listening volume in the lower end of the normal listening range, consistent with the increase change control rate 204 $R_{I2}$ for the zone 202-B. In the zone 202-A, the ramp down change control rate 204 $R_{D1}$ may be set to 0.1 dB decreases to provide sensitive volume control when approaching zero volume.

FIG. 3 illustrates a look-up table 300 of the volume mapping 112, including volume ramp up control rates 204 and volume ramp down control rates 204 indexed according to zone 202 in accordance to one embodiment. The volume mapping 112, as specified by the look-up table 300, may accordingly be stored in a form included within or otherwise accessible to the volume controller 108. It should be noted that the look-up table 300 representation is an example, and other data structures or representations of the volume ramp up control rates 204 and volume ramp down control rates 204 may be used. Regardless of the specific data structure used, when determining the amount to adjust the current volume level 110 based on input received from the volume user interface 104, the volume controller 108 may utilize the volume mapping 112 to retrieve an appropriate control rate 204 based on the zone 202 in which the current volume level 110 is included and the requested direction of change of the current volume level 110.

Figure 4:
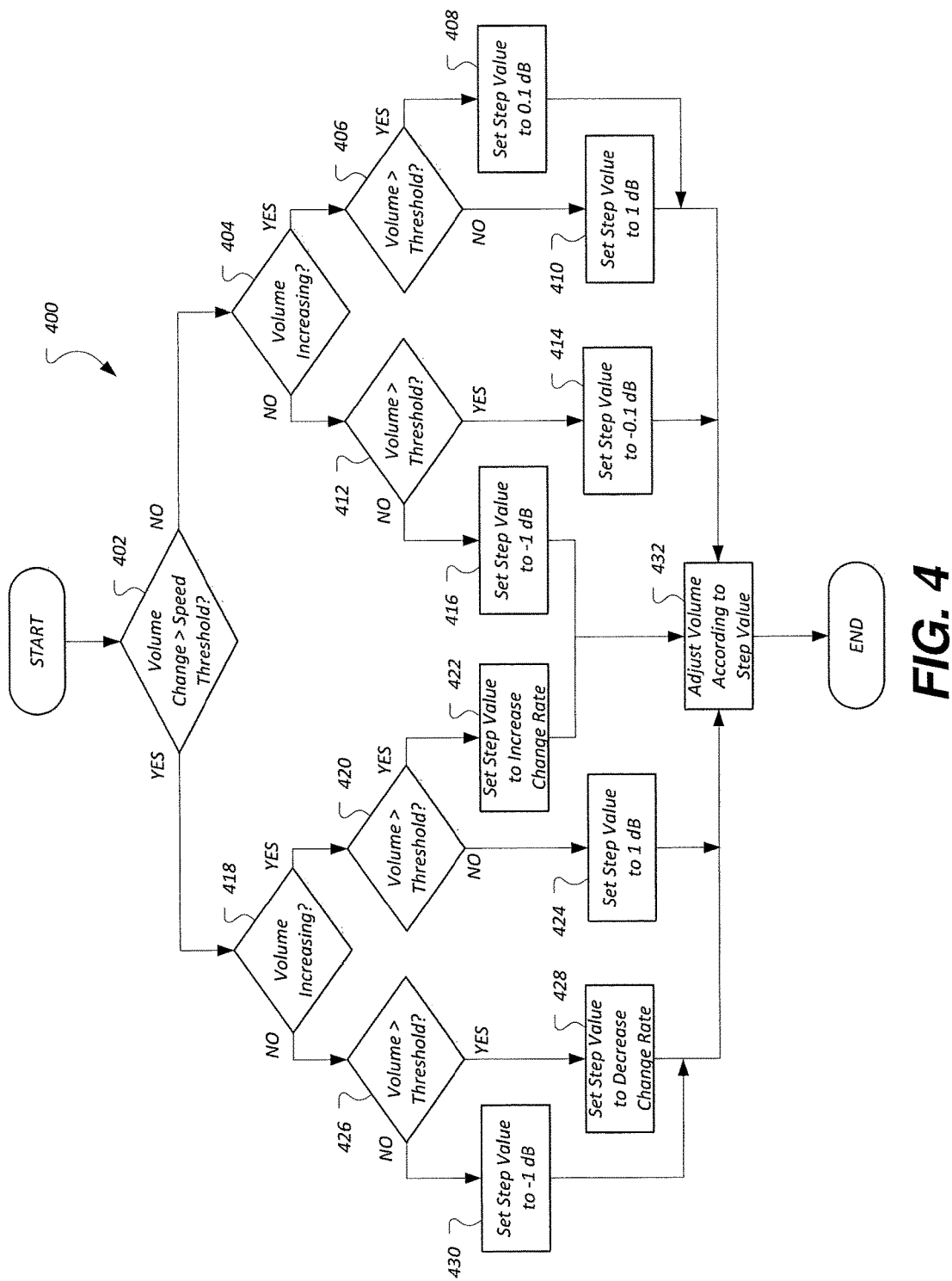
FIG. 4 illustrates a process for identifying a volume control rate to use to adjust a volume level in accordance to one embodiment.

FIG. 4 illustrates a process 400 for identifying a volume control rate 204 to use to adjust the current volume level 110 of the amplifier 106 in accordance to one embodiment. The process 400 may be performed, for example, by the volume controller 108 of the audio system 100 upon identifying user or other volume input from the volume user interface 104 indicative of a user request to change the current volume level 110.

At operation 402, the volume controller 108 determines whether a user has requested a volume change that is greater than a predefined speed threshold. In an example, the volume controller 108 may sample the position of the volume user interface 104 at predetermined intervals, and may place the sampled values into a data grid holding the sampled values over a predefined number of sampling periods. The volume controller 108 may then identify the rate of volume change over the sampling periods, and if the difference does not exceed the predefined speed threshold, the volume controller 108 may determine that the volume change is a slow change. In a more specific example, the predefined speed threshold may be set to a greater than a 3 dB change in volume within one second. If the volume controller 108 determines that the change in volume is not greater than the predefined speed threshold, control passes to operation 404. Otherwise, control passes to operation 418.

At operation 404, the volume controller 108 determines the direction of the volume change. For example, based on the change in sampled volume position between the current and previous sampling periods, the volume controller 108 may identify whether an increase or a decrease in volume was requested. If an increase in volume was requested, control passes to operation 406. Otherwise, control passes to operation 412.

At operation 406, the volume controller 108 determines whether the current volume level 110 exceeds a predetermined volume threshold. As one possibility, the predetermined volume threshold may be set to a level corresponding to the lower end of the normal listening range, e.g., 23 dB. If the current volume level 110 exceeds the predetermined volume threshold, control passes to operation 408. Otherwise control passes to operation 410.

At operation 408, the volume controller 108 sets the step value for the volume change to a relatively smaller increase step size suitable for slow volume changes in a normal volume range, such as 0.1 dB. At operation 410, the volume controller 108 sets the step value for the volume change to a relatively larger increase step size suitable for lower volume conditions, such as 1.0 dB. After operations 408 or 410, control passes to operation 432 to adjust the current volume level 110.

At operation 412, the volume controller 108 determines whether the current volume level 110 exceeds the predetermined volume threshold. If so, control passes to operation 414. Otherwise control passes to operation 416. At operation 414, the volume controller 108 sets the step value for the volume change to a relatively smaller decrease step size suitable for slow changes during normal volume conditions, such as −0.1 dB. At operation 410, the volume controller 108 sets the step value for the volume change to a relatively larger decrease step size suitable for low volume conditions, such as −1.0 dB. After operations 414 or 416, control passes to operation 432 to adjust the current volume level 110.

At operation 418, the volume controller 108 determines the direction of the volume change. If an increase in volume was requested, control passes to operation 420. Otherwise, control passes to operation 426. At operation 420, the volume controller 108 determines whether the current volume level 110 exceeds the predetermined volume threshold. If so, control passes to operation 422. Otherwise control passes to operation 424.

At operation 422, the volume controller 108 sets the step value for the volume change to an increase step size in accordance with the volume mapping 112. For example, the volume controller 108 may utilize the look-up table 300 to identify, based on the current volume level 110, the volume ramp up change control rate 204 to use to adjust the current volume level 110. At operation 424, the volume controller 108 sets the step value for the volume change to a relatively larger increase step size suitable for low volume conditions, such as 1.0 dB. After operations 422 or 424, control passes to operation 432 to adjust the current volume level 110.

At operation 426, the volume controller 108 determines whether the current volume level 110 exceeds the predetermined volume threshold. If so, control passes to operation 428. Otherwise control passes to operation 430. At operation 428, the volume controller 108 sets the step value for the volume change to a decrease step size in accordance with the volume mapping 112. For example, the volume controller 108 may utilize the look-up table 300 to identify, based on the current volume level 110, the volume ramp down change control rate 204 to use to adjust the current volume level 110. At operation 424, the volume controller 108 sets the step value for the volume change to a relatively larger decrease step size suitable for low volume conditions, such as −1.0 dB. After operations 428 or 420, control passes to operation 432 to adjust the current volume level 110.

At operation 432, the volume controller 108 adjusts the current volume level 110 according to the identified step value. Accordingly, the volume controller 108 may adjust the current volume level 110 in accordance with a segmented linear approach, to approximate ear non-linearity, while addressing specific volume control use cases. After operation 432, the process 400 ends.

Computing devices described herein, such as the volume controller 108 in some implementations, generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

With regard to the processes, systems, methods, heuristics, etc., described herein, it should be understood that, although the steps of such processes, etc., have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A system comprising:
a processor of a volume controller programmed to
maintain a volume mapping including a plurality of zones of volume level, each zone defined according to a range including a plurality of included volume levels and specifying a fixed volume ramp up control rate and a fixed volume ramp down control rate for adjustment of volume levels within the range regardless of a speed of a requested volume change, at least one of the plurality of zones specifying a fixed volume ramp up control rate and a fixed volume ramp down control rate that differ in absolute value,
identify, according to the volume mapping based on a current volume level and a direction of the requested volume change, to use either the fixed volume ramp up control rate or the fixed volume ramp down control rate as a step value for adjusting the current volume level, and
adjust the current volume level according to the step value.

2. The system of claim 1, wherein the plurality of zones of volume level includes a first zone from a minimum volume to a lower bound of a normal listening range, a second zone from the lower bound of the normal listening range to a midpoint of the normal listening range, a third zone from the midpoint of the normal listening range to an upper bound of the normal listening range, and a fourth zone from the upper bound of the normal listening range to a maximum volume.

3. The system of claim 1, wherein the volume ramp up control rate and the volume ramp down control rate of the zones within a normal listening range are set to equal step sizes, and the volume ramp up control rate and the volume ramp down control rate of the plurality of zones outside the normal listening range are set to different step sizes.

4. The system of claim 1, wherein the volume controller is further configured to:
determine a requested rate of change to the current volume level, and
utilize the volume mapping to determine the step value when the rate of change exceeds a predetermined speed threshold.

5. The system of claim 4, wherein the volume controller is further configured to:
maintain a plurality of periodically polled user interface values of a volume user interface, and
identify the requested rate of change to the current volume level according to the plurality of periodically polled user interface values.

6. The system of claim 4, wherein the volume controller is further configured to utilize fixed volume ramp up and a volume ramp down control rates to adjust the current volume level when the rate of change does not exceed the predetermined speed threshold.

7. The system of claim 4, wherein the volume controller is further configured to:
maintain a second volume mapping including a second plurality of zones of volume level, each zone defined according to a range of volume level and specifying a volume ramp up control rate and a volume ramp down control rate for adjusting volume levels within the zone, and
utilize the second volume mapping to adjust the current volume level when the rate of change does not exceed the predetermined speed threshold.

8. The system of claim 7, wherein the second volume mapping includes a first zone from a minimum volume to a lower bound of a normal listening range, and a second zone from the lower bound of the normal listening range to a maximum volume.

9. The system of claim 2, wherein the lower bound of the normal listening range is 23 dB, the midpoint of the normal listening range is 40 dB. and the upper bound of the normal listening range is 60 dB.

10. A system comprising:
a processor of a volume controller programmed to
maintain a first predefined volume mapping including a plurality of zones of volume level, each zone defined according to a range including a plurality of volume levels and specifying a fixed volume ramp up control rate and a fixed volume ramp down control rate for adjusting volume levels within the zone, maintain a second predefined volume mapping including a second plurality of zones of volume level, each zone defined according to a range including a plurality of volume levels and specifying a fixed volume ramp up control rate and a fixed volume ramp down control rate for adjusting volume levels within the zone, identify whether to use the first predefined volume mapping or the second predefined volume mapping according to a requested rate of change to a current volume level, and determine, based on a current volume level and a direction of a requested volume change, to use either the volume ramp up control rate or the volume ramp down control rate of the identified predefined volume mapping as a step value for adjusting the current volume level.

11. The system of claim 10, wherein the volume controller is further configured to adjust the current volume level according to the step value.

12. The system of claim 10, wherein the second predefined volume mapping includes fewer zones than the first predefined volume mapping and is utilized for rates of change to the current volume level below a predetermined threshold difference in change of the current volume level.

13. The system of claim 10, wherein the volume controller is further configured to:
maintain a plurality of periodically polled user interface values of a volume user interface, and
identify the requested rate of change to the current volume level according to the plurality of periodically polled user interface values.

14. A non-transitory computer-readable medium encoded with computer executable instructions, the computer executable instructions executable by a processor, the computer-readable medium comprising instructions configured to:
maintain a volume mapping including a plurality of zones of volume level, each zone defined according to a range including a plurality of volume levels and specifying a fixed volume ramp up control rate and a fixed volume ramp down control rate for adjusting volume levels within the zone regardless of a speed of a requested volume change, at least one of the plurality of zones specifying a fixed volume ramp up control rate and a fixed volume ramp down control rate that differ in absolute value,
identify, according to the volume mapping based on a current volume level and a direction of the requested volume change, to use either the fixed volume ramp up control rate or the fixed volume ramp down control rate as a step value for adjusting the current volume level,
adjust the current volume level according to the step value.

15. The computer-readable medium of claim 14, wherein the plurality of zones of volume level includes a first zone from a minimum volume to a lower bound of a normal listening range, a second zone from the lower bound of the normal listening range to a midpoint of the normal listening range, a third zone from the midpoint of the normal listening range to an upper bound of the normal listening range, and a fourth zone from the upper bound of the normal listening range to a maximum volume.

16. The computer-readable medium of claim 15, wherein the volume ramp up control rate and the volume ramp down control rate of the zones within the normal listening range are set to equal step sizes, and the volume ramp up control rate and the volume ramp down control rate of the plurality of zones outside the normal listening range are set to different step sizes.

17. The computer-readable medium of claim 15, further comprising instructions configured to:
determine a requested rate of change to the current volume level, and
utilize the volume mapping to determine the step value when the rate of change exceeds a predetermined speed threshold.

18. The computer-readable medium of claim 17, further comprising instructions configured to:
maintain a plurality of periodically polled user interface values of a volume user interface, and
identify the requested rate of change to the current volume level according to the plurality of periodically polled user interface values.

19. The computer-readable medium of claim 17, further comprising instructions configured to:
maintain a second volume mapping including a second plurality of zones of volume level, each zone defined according to a range of volume level and specifying a volume ramp up control rate and a volume ramp down control rate for adjusting volume levels within the zone, and
utilize the second volume mapping to adjust the current volume level when the rate of change does not exceed the predetermined speed threshold.

20. The computer-readable medium of claim 19, wherein the second volume mapping includes a first zone from a minimum volume to a lower bound of a normal listening range, and a second zone from the lower bound of the normal listening range to a maximum volume.

21. The computer-readable medium of claim 14, wherein the volume ramp up control rate and the volume ramp down control rate of the zones within a normal listening range are set to equal step sizes, and the volume ramp up control rate and the volume ramp down control rate of the plurality of zones outside the normal listening range are set to different step sizes.

* * * * *